US011606882B2

(12) United States Patent
Griffin et al.

(10) Patent No.: US 11,606,882 B2
(45) Date of Patent: Mar. 14, 2023

(54) AEROTHERMAL RING STRUCTURES PROVIDING RF ISOLATION

(71) Applicant: BAE Systems Information and Electronic Systems Integration Inc., Nashua, NH (US)

(72) Inventors: Jonathan C. Griffin, Westford, MA (US); Ross T. Johnson, Nashua, NH (US); Gregory J. Wunsch, Milford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 300 days.

(21) Appl. No.: 17/090,341

(22) Filed: Nov. 5, 2020

(65) Prior Publication Data

US 2022/0142004 A1 May 5, 2022

(51) Int. Cl.
*H05K 7/20* (2006.01)
*H04B 15/02* (2006.01)
*F41G 7/22* (2006.01)

(52) U.S. Cl.
CPC ......... *H05K 7/20418* (2013.01); *F41G 7/224* (2013.01); *F41G 7/2246* (2013.01); *H04B 15/02* (2013.01)

(58) Field of Classification Search
CPC ....... F41G 7/224; F41G 7/2246; H04B 15/02; H05K 7/20418
See application file for complete search history.

(56) References Cited

U.S. PATENT DOCUMENTS

| 4,320,402 A * | 3/1982 | Bowen | ................... H01Q 21/24 343/769 |
| 5,168,348 A * | 12/1992 | Chu | ..................... H01L 23/4338 257/713 |
| 7,375,688 B1 * | 5/2008 | Francque | ............. H01Q 17/001 343/705 |
| 7,525,496 B2 * | 4/2009 | Francque | ............. H01Q 17/001 343/705 |

(Continued)

OTHER PUBLICATIONS

Cutler, C. C., "Electromagnetic Waves Guided by Corrugated Conducting Surfaces," Bell Telephone Labs. Report MM-44-160-218; Oct. 1944. 35 pages.

(Continued)

*Primary Examiner* — Jacob R Crum
(74) *Attorney, Agent, or Firm* — Finch & Maloney PLLC

(57) ABSTRACT

A heat dissipation structure is disclosed that is especially well-suited for use on aerodynamic systems. The heat dissipation structure is formed within a metallic body that surrounds the heat-generating electronics. The heat dissipation structure is designed to both dissipate the generated heat and also to isolate RF cross-talk between the one or more transmitters and receivers. The heat dissipation structure includes a plurality of ring structures that extend around at least a portion of a body that houses the one or more heat-generating electrical components. The plurality of ring structures may be recessed into the body, and a first spacing between a first adjacent pair of ring structures of the plurality of ring structures is different from a second spacing between a second adjacent pair of ring structures of the plurality of ring structures.

20 Claims, 7 Drawing Sheets

(56) References Cited

U.S. PATENT DOCUMENTS

| | | | | |
|---|---|---|---|---|
| 2004/0246183 A1* | 12/2004 | Chandler | ............ | H01Q 21/061 343/701 |
| 2008/0136717 A1* | 6/2008 | Francque | ............ | H01Q 17/001 343/705 |
| 2008/0218421 A1* | 9/2008 | Francque | ............ | H01Q 17/001 343/705 |
| 2012/0155015 A1* | 6/2012 | Govindasamy | ......... | H01L 23/36 361/688 |
| 2016/0066476 A1* | 3/2016 | Gu | ..................... | H01L 23/3675 165/185 |

OTHER PUBLICATIONS

Elliott, R.S., "On the Theory of Corrugated Plan Surfaces," I.R.E. Transactions—Antennas and Propagation, Apr. 1954. pp. 71-81.

\* cited by examiner

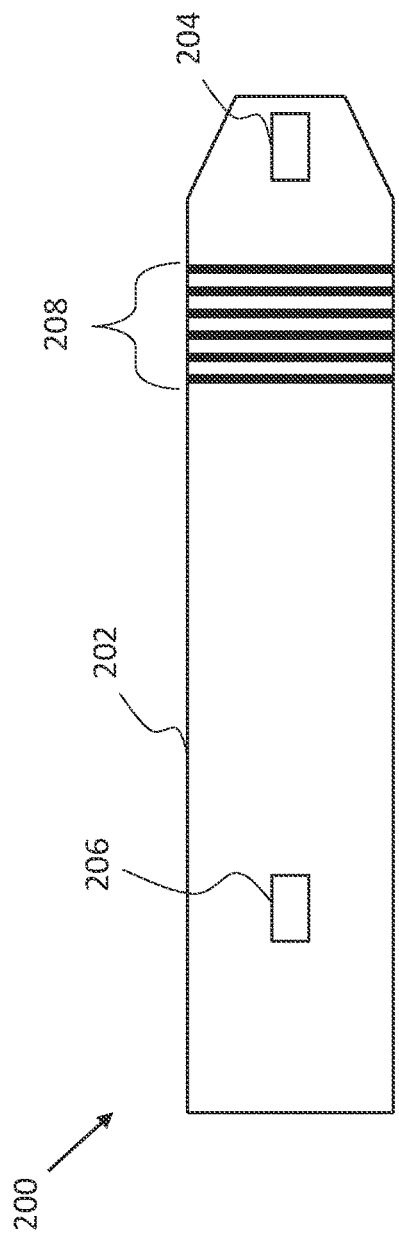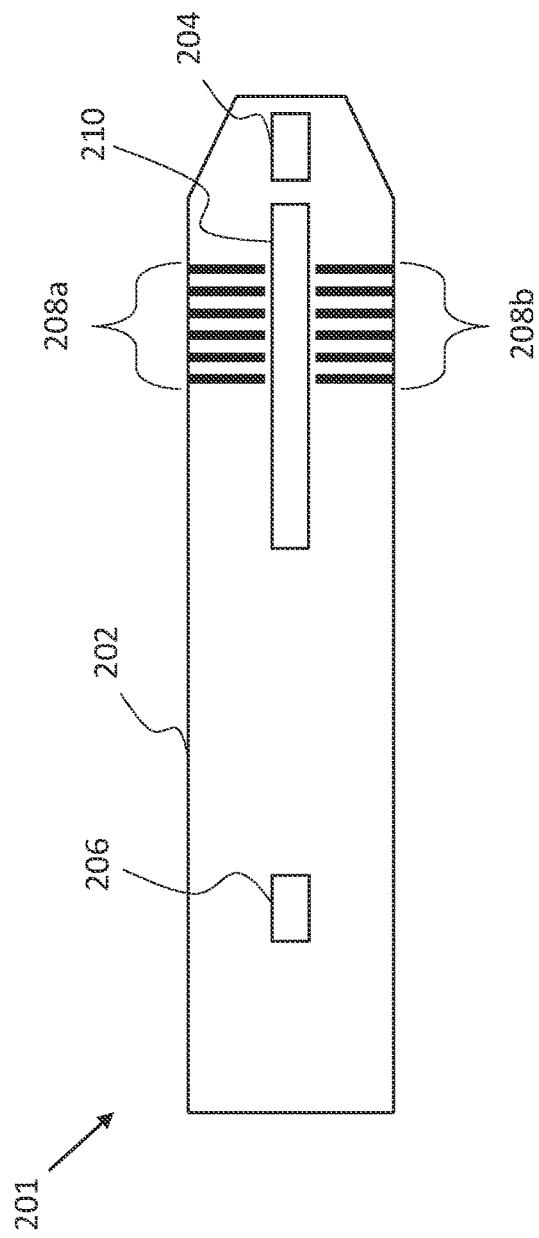

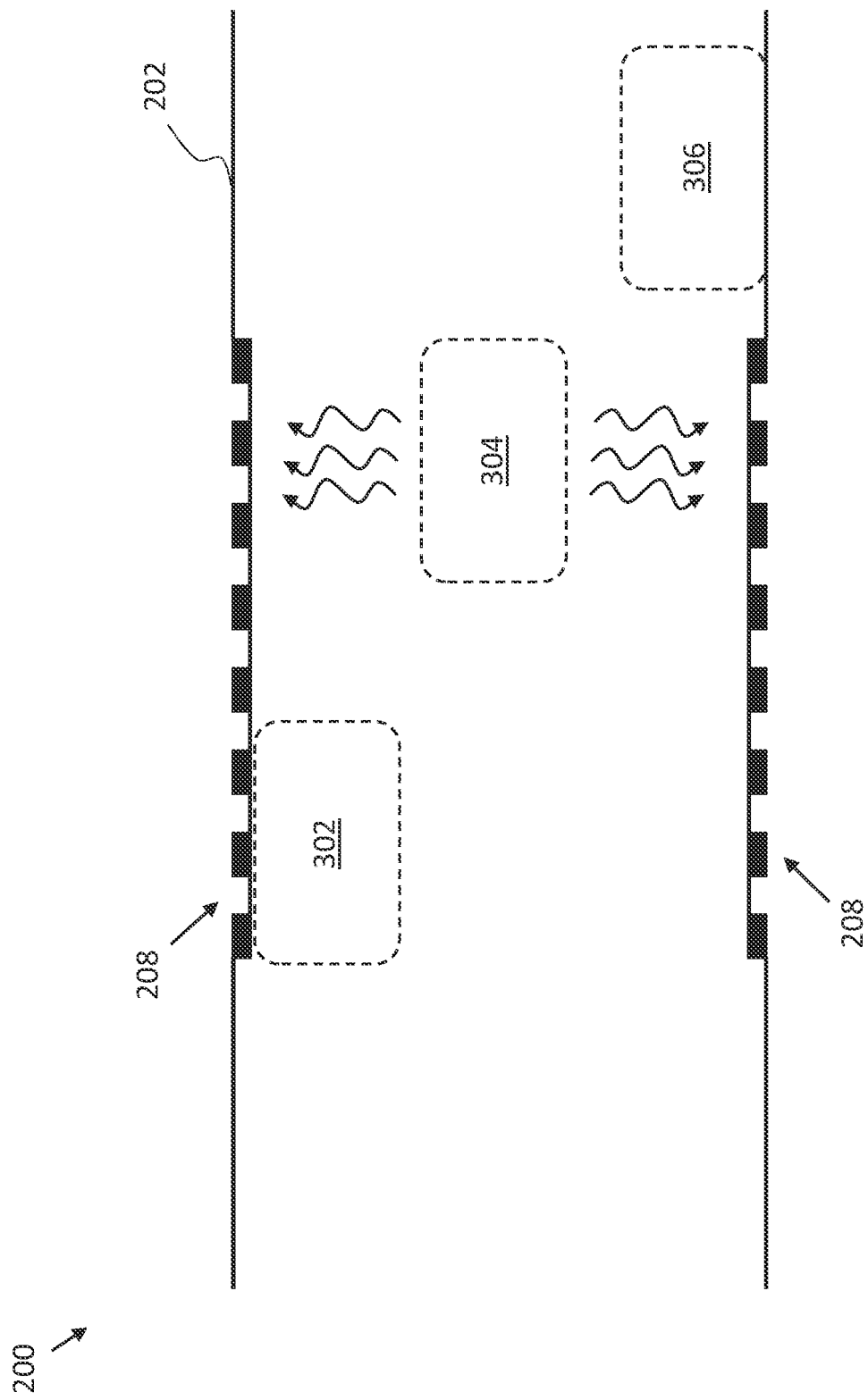

US 11,606,882 B2

AEROTHERMAL RING STRUCTURES PROVIDING RF ISOLATION

GOVERNMENT LICENSE RIGHTS

This invention was made with government support under contract #N00019-19-C-1025 awarded by the U.S. Navy. The government has certain rights in the invention.

BACKGROUND

Power electronics tend to generate a great deal of heat that needs to be mitigated to ensure longevity and robustness. This is especially true for some applications that require the electronics to be enclosed in a relatively small space, such as within guided projectiles. Heat sink structures may be used to provide increased surface area and facilitate dissipation of excess heat. However, designing such structures becomes complicated when other factors must simultaneously be considered, such as the aerodynamics of the structures, as well as their effect on the host system's other functions such as the ability to transmit and/or receive RF signals, as is further explained herein. Accordingly, there are many non-trivial issues with regards to designing heat dissipation structures for certain applications.

BRIEF DESCRIPTION OF THE DRAWINGS

Features and advantages of embodiments of the claimed subject matter will become apparent as the following Detailed Description proceeds, and upon reference to the Drawings, in which:

FIGS. 2A and 2B illustrate different examples of heat dissipation structures on an aerodynamic system, in accordance with some embodiments of the present disclosure;

FIG. 3 illustrates some examples of heat transfer via heat dissipation structures on an aerodynamic system, in accordance with some embodiments of the present disclosure;

Figure 1:
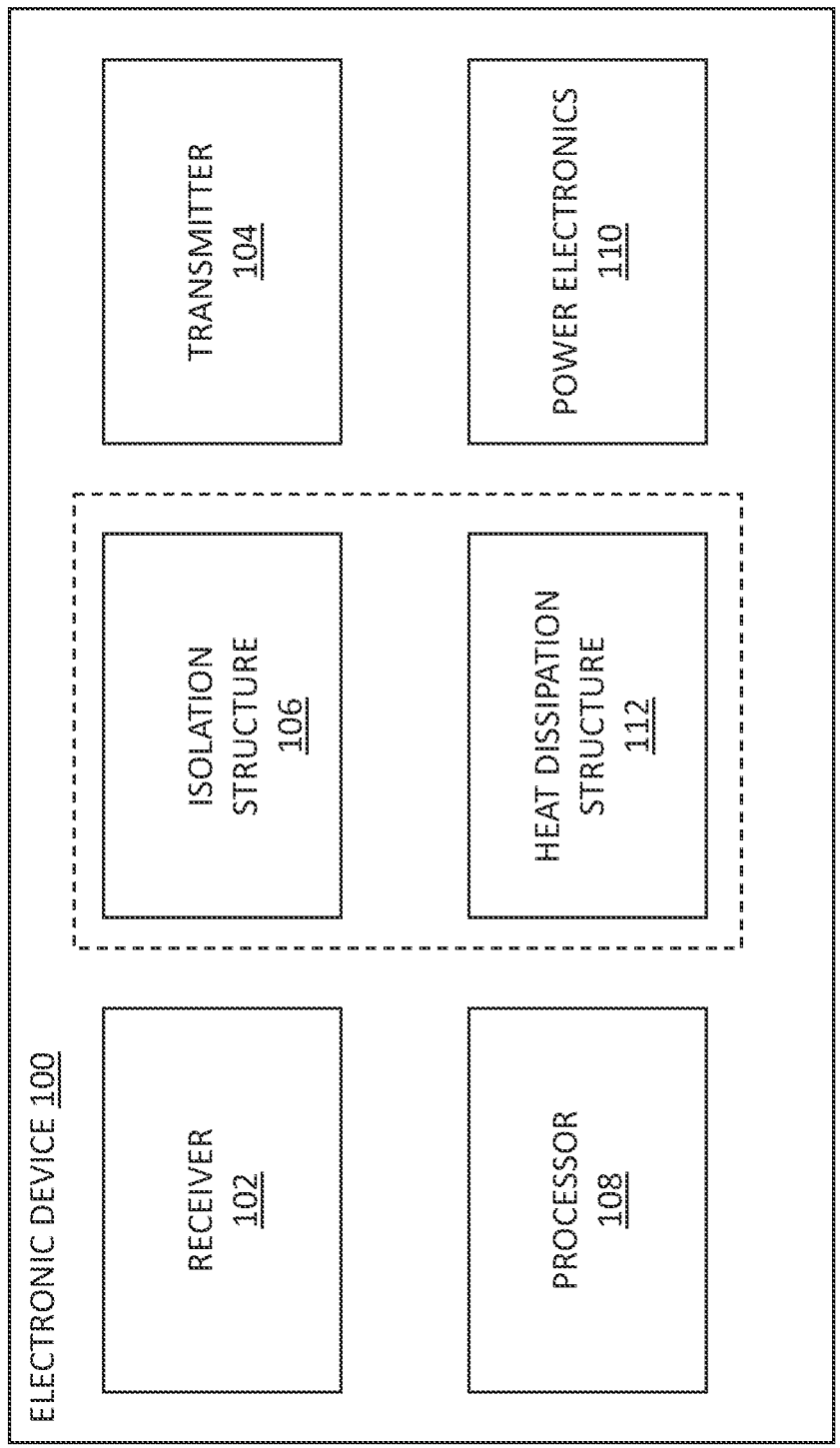
FIG. 1 illustrates a block diagram of an electronic device, configured in accordance with an embodiment of the present disclosure.

Although the following Detailed Description will proceed with reference being made to illustrative embodiments, many alternatives, modifications, and variations thereof will be apparent in light of this disclosure.

DETAILED DESCRIPTION

Heat dissipation structures are disclosed that are especially well-suited for use on aerodynamic systems such as guided projectiles or other aerobodies. In an embodiment, the heat dissipation structure is formed within a metallic body that at least partially surrounds the heat-generating electronics. In some such cases, these electronics include components that generate a non-trivial amount of heat, such as power amplifiers and radio frequency (RF) transmitters and receivers. According to some such embodiments, the heat dissipation structure is designed to both dissipate the generated heat and also reduce RF cross-talk between on-board transmitter and receiver circuits. The heat dissipation structure includes a plurality of ring structures that extend circumferentially around at least a portion of a body that houses one or more heat-generating electrical components. The plurality of ring structures are recessed into the body, and the spacing between such structures may be consistent or varied. For instance, some such embodiments, a first spacing between a first adjacent pair of ring structures of the plurality of ring structures is different from a second spacing between a second adjacent pair of ring structures of the plurality of ring structures. The spacing between different adjacent pairs of ring structures may change in a pseudo-random repeating pattern, which helps to reduce cross-talk of particular frequency bands, as further discussed herein. Numerous embodiments and variations will be appreciated in light of this disclosure.

General Overview

Heat mitigation is just one of many important factors engineers must consider when designing electronic devices. Some devices, in particular, are more challenging than others to design useful heat mitigation structures. For example, guided aerodynamic systems utilize advanced electronics and RF communication devices within a compact space, which generates heat. While traditional heat mitigation techniques can be used, such techniques can cause problems with respect to other performance areas of the host system. For instance, and as will be appreciated in light of this disclosure, due to the compactness of the environment in which heat-generating components like power amplifiers and RF communication devices reside, standard heat mitigation structures can have an adverse effect on the RF performance of the host system. Additionally, the aerodynamics of a moving host system (e.g., guided system) may be adversely affected by standard heat dissipation structures deployed on the system.

Thus, heat dissipation structures are provided herein for use on electronic devices, including those housed within guided aerodynamic systems or other cylindrical compact environments that have a need for heat dissipation, aerodynamics, and/or RF isolation. In some embodiments, the heat dissipation structures are formed directly from a metallic body or housing that surrounds the electronics. In the case of aerodynamic systems or other high-speed compact RF systems having a cylindrical body, the heat dissipation structures are formed around the cylindrical body, so as to be part of the skin of the aerodynamic system. According to some such embodiments, the heat dissipation structures include a plurality of annular rings that extend circumferentially around at least a portion of the cylindrical body. The spacing between adjacent ones of the annular rings may be adjusted to optimize not only the heat dissipation, but also the RF isolation between an on-board transmitter and an on-board receiver. For instance, the heat dissipation structures may be arranged to be physically located between the RF transmitter and the RF receiver of the system. According to some such embodiments, the heat dissipation structures include annular rings that are recessed into the body and have a circular profile. A number of geometric variations and similar uses for the heat dissipation structures will be apparent based on the example embodiments disclosed herein.

According to one example embodiment of the present disclosure, an aerodynamic system includes a body having a cylindrical shape, and a plurality of ring structures extending around at least a portion of a circumference (perimeter) of the body. The plurality of ring structures are recessed into the body, and a first spacing between a first adjacent pair of ring structures of the plurality of ring structures is different from a second spacing between a second adjacent pair of ring structures of the plurality of ring structures. Other embodiments may have consistent spacing between ring structures.

According to another example embodiment of the present disclosure, an electronic device includes a body, an RF transmitter disposed at a first location within the body, an RF receiver disposed at a second location within the body, and a plurality of ring structures extending around at least a portion of a circumference of the body between the first location and the second location. The plurality of ring structures are recessed into the body, and a first spacing between a first adjacent pair of ring structures of the plurality of ring structures is different from a second spacing between a second adjacent pair of ring structures of the plurality of ring structures. Other embodiments may have consistent spacing between ring structures.

According to another example embodiment of the present disclosure, a heat dissipation structure includes a plurality of ring structures extending around at least a portion of a body that houses one or more heat-generating electrical components. The plurality of ring structures are recessed into the body, and a first spacing between a first adjacent pair of ring structures of the plurality of ring structures is different from a second spacing between a second adjacent pair of ring structures of the plurality of ring structures. Other embodiments may have consistent spacing between ring structures.

Electronic Device Overview

FIG. 1 illustrates an example electronic device 100, according to an embodiment. Electronic device 100 may include one or more electrical components such as an RF receiver 102 and an RF transmitter 104. As can be further seen, an isolation structure 106 is provided between receiver 102 and transmitter 104 to ensure that RF signals generated by transmitter 104 are not received by receiver 102 (or at least isolation structure 106 inhibits cross-talk between receiver 102 and transmitter 104). Electronic device 100 may also include a processor 108 with associated memory and power electronics 110. The memory can include one or more memory devices such as volatile memory (e.g., dynamic random-access memory (DRAM)), nonvolatile memory (e.g., read-only memory (ROM)), flash memory, solid state memory, and/or a hard drive. Electronic device 100 also includes a heat dissipation structure 112 to mitigate the heat generated from any and/or all of the electrical components of electronic device 100. In some embodiments, heat dissipation structures 112 may take on the form of a series of structures that extend circumferentially around a portion of a body that houses the various components of electronic device 100. According to some embodiments, the heat dissipation structure disclosed herein allows the structure to act as both the isolation structure 106 and the heat dissipation structure 112. This dual-function nature of heat dissipation structure 112 is generally depicted in FIG. 1 with a dashed line box around isolation structure 106 and heat dissipation structure 112. Further details of isolation structure 106 and heat dissipation structure 112 will be provided with reference to subsequent figures.

Electronic device 100 may represent any type of computing platform or module, such as, for example, a guidance section of an aerodynamic system, a navigation system, a tracking system, an imaging system, an unmanned autonomous vehicle (UAV) system, a satellite system, a high-speed vehicle, or any other system having a relatively compact design and a need for both heat dissipation along with RF isolation and/or aerodynamic performance. In some embodiments, electronic device 100 is incorporated within a guided munition or projectile such as a bullet, shell, missile, torpedo, or rocket, to name a few examples. In such cases, note the payload carried by the projectile can vary from one application to the next, and need not be limited to explosives or lethal payloads. For instance, the payload could be supplies (e.g., food, equipment), personnel, communications gear (e.g., to provide an airborne communications node over a given region), imaging gear or other sensor-based gear (e.g., weather sensors such as for temperature and humidity, gas sensors, speed sensors), illumination gear (e.g., to illuminate an area with visible light), and surveillance gear, to name a few examples.

Either or both of receiver 102 and transmitter 104 may implement any of a number of wireless standard or proprietary protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Either or both of receiver 102 and transmitter 104 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Either or both of receiver 102 and transmitter 104 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Either or both of receiver 102 and transmitter 104 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some example embodiments, either or both of receiver 102 and transmitter 104 operate in the X, $K_u$, $K_a$, or Q band of the electromagnetic spectrum.

Processor 108 can be any suitable processor and may include one or more coprocessors or controllers to assist in control and processing operations associated with electronic device 100. In some embodiments, processor 108 may be implemented as any number of processor cores. The processor (or processor cores) may be any type of processor, such as, for example, a micro-processor, an embedded processor, a digital signal processor (DSP), a graphics processor (GPU), a network processor, a field programmable gate array (FPGA) or purpose-built semiconductor, or other device configured to execute code or gate-level logic. The processors may be multithreaded cores in that they may include more than one hardware thread context (or "logical processor") per core.

Power electronics 110 may represent any solid-state electronics used for the control and conversion of electric power. In some embodiments, power electronics 110 includes one or more power amplifiers, such as power metal-oxide-semiconductor field-effect transistors (MOSFETs), that generate relatively large amounts of heat. Other example elements of power electronics 110 may include bipolar junction transistors (BJTs), silicon controlled rectifiers and thyristors, digital-to-analog converters (DAC), and analog-to-digital converters (ADC).

FIGS. 2A and 2B illustrate different aerodynamic system configurations, according to some embodiments. As previously noted, the aerodynamic systems may be any caliber or type of guided projectile that houses electrical components, such as RF communication components or other guidance electronics. In one example, the aerodynamic systems represent guided munitions, but other applications will be apparent. FIG. 2A illustrates an aerodynamic system 200 having a body 202 and at least one transmitter 204 and at least one receiver 206 housed within body 202. Although transmitter 204 is illustrated as being in the front portion of aerodynamic system 200, in some embodiments, the locations of transmitter 204 and receiver 206 are switched. According to an embodiment, aerodynamic system 200 includes a heat dissipation structure 208 which is deployed around a portion of body 202 and spatially arranged between the locations of transmitter 204 and receiver 206. Heat dissipation structure 208 may be located closer to the front of aerodynamic system 200, as illustrated in the example embodiments of FIGS. 2A-B. In some other example embodiments, heat dissipation structure 208 is located around a portion of body 202 that is equidistant from both transmitter 204 and receiver 206. As will be further appreciated, heat dissipation structure 208 generally corresponds to heat dissipation structure 112 of FIG. 1, and may further correspond to isolation structure 106 of FIG. 1.

The body 202 may have any number of configurations and may be implemented from any number of materials. For instance, the body 202 may be a cylinder of light weight material such as titanium or a polymer composite. The body 202 may be one monolithic piece of material or may be multiple pieces that are individually formed and then joined in a subsequent process. In the latter case, multiple materials may be used, such as an aluminum end cap, a titanium central body portion, and a polymeric nose cone. In a more general sense, the body 202 is not intended to be limited to any particular design or configuration. In any such cases, the heat dissipation structure(s) 208 is provided in the outer surface of the body 202, whether by a machining process (e.g. lathe), a molding process, a bonding process, and/or some other manufacturing process suitable for forming such structures in body 202.

In FIG. 2A, heat dissipation structure 208 includes a plurality of structures that extend circumferentially around an entire perimeter of body 202. In the case of a cylindrical body 202, such as that with respect to certain aerodynamic systems, heat dissipation structure 208 includes a plurality of annular structures that extend completely around the cylindrical body 202. The annular structures may be recessed into the outer surface of body 202 for aerodynamic purposes (in the case of aerodynamic systems) and spaced from each other in a set pattern, pseudo-random pattern, or constant spacing as discussed in more detail with reference to FIG. 3A. In some such embodiments, heat dissipation structure 208 extends down only a portion of the longitudinal length along aerodynamic system 200 between transmitter 204 and receiver 206. For example, heat dissipation structure may extend down less than 5%, less than 10%, less than 15%, less than 20%, less than 25%, less than 30%, less than 35%, less than 40%, less than 45%, less than 50%, less than 55%, less than 60%, less than 65%, less than 70%, less than 75%, less than 80%, less than 85%, less than 90%, or less than 95% of the length along aerodynamic system 200 between transmitter 204 and receiver 206. In some other embodiments, heat dissipation structure 208 extends along the entire length of body 202 between transmitter 204 and receiver 206. In still other embodiments, a second heat dissipation structure may be provided around body 202 between transmitter 204 and receiver 206, so as to be distanced from a first heat dissipation structure 208. Third, fourth, or another number of additional heat dissipation structures 208 may be so deployed in a spaced fashion along the length of body 202 between transmitter 204 and receiver 206, so as to provide distinct bands or sections of heat dissipation structures 208. The additional heat dissipation structure(s) may have the same structural design as heat dissipation structure 208 in some example embodiments, while in other example embodiments may have different spacing within a given set of heat dissipation structures 208 (a first band of heat dissipation structures with a first inter-ring spacing scheme, and a second band of heat dissipation structures with a second inter-ring spacing scheme that is different from the first inter-ring spacing scheme).

FIG. 2B illustrates another example of an aerodynamic system 201 having body 202 and at least one transmitter 204 and at least one receiver 206 housed within body 202. The descriptions of body 202, transmitter 204, and receiver 206 from FIG. 2A are also applicable to FIG. 2B. However, aerodynamic system 201 may include one or more other structures 210 on the surface of body 202 that interrupts the ability for the heat dissipation structure to extend fully around the outside of body 202, such as a fin, window, grip point or other obstacle. Thus, and in accordance with an embodiment, the circumferential nature of the heat dissipation structure may be non-continuous or otherwise broken up into any number of sections that extend around a portion of the circumference or perimeter of body 202. The number and distance of breaks interrupting the continuity of the circumferential features making up the structure can vary from one embodiment to the next, and may depend on the geometry of structure 210. For example, a first heat dissipation structure section 208a may extend around a first portion of body 202 while a second heat dissipation structure section 208b may extend around another portion of body 202, with the structure 210 interrupting continuity between the two sections as shown. Each of first and second heat dissipation structure sections 208a/208b can include similar structures, such as recessed annular rings, that only extend around a given portion of the perimeter of body 202. In the example shown, the rings of heat dissipation structure section 208a are co-linear or otherwise aligned with the rings of first heat dissipation structure section 208b. In other such embodiments, the rings of one heat dissipation structure section may be offset with the rings of another heat dissipation structure section. Such an offset may be used to tune performance parameters such as drag, heat dissipation, and/or RF isolation, as will be appreciated in light of this disclosure. Any number of heat dissipation structure sections may be used, where each section can extend around any portion of body 202 between transmitter 204 and receiver

206. Any one of the heat dissipation structure sections may extend down less than 5%, less than 10%, less than 15%, less than 20%, less than 25%, less than 30%, less than 35%, less than 40%, less than 45%, less than 50%, less than 55%, less than 60%, less than 65%, less than 70%, less than 75%, less than 80%, less than 85%, less than 90%, or less than 95% of the length along aerodynamic system 201 between transmitter 204 and receiver 206.

FIG. 3 illustrates an example cross section view of aerodynamic system 200 having heat dissipation structure 208 around an outer surface of body 202, and various possible locations for electronics, according to some embodiments. One or more electrical components may be arranged at a first location 302 that is in contact with an inside wall of body 202, such that heat transfer to heat dissipation structure 208 occurs mainly via thermal conduction. In some embodiments, first location 302 is in direct contact with heat dissipation structure 208. In some embodiments, the one or more electrical components at first location 302 includes one or more power amplifiers such that at least a portion of the one or more power amplifiers (such as the top surface of metal packaging of a power transistor) directly contacts the backside of heat dissipation structure 208 to facilitate conductive heat transfer. In some embodiments, heat dissipation structure 208 acts as a heat sink structure for the one or more electrical components at first location 302, such that heat dissipation structure 208 is an integral component of the one or more electrical components at first location 302.

According to an embodiment, one or more electrical components may be arranged at a second location 304, which represents any portion within aerodynamic system 200 that is not in direct contact with the inner surface of housing 202. For the one or more electrical components at second location 304, heat transfer may occur primarily via radiation from the components towards the inner surface of housing 202, or via structural heat conductors that physically connect such electrical components to the inner surface of housing 202. In any such cases, the excess heat from such electrical components is thermally conducted through the wall of housing 202 to heat dissipation structure 208.

As shown in the example embodiment of FIG. 3, one or more electrical components may be arranged at a third location 306, which represents any location on an inner surface of housing 202 that is not directly under or otherwise aligned with heat dissipation structure 208. However, due to the contact with housing 202, heat transfer still occurs via thermal conduction, such that excess heat may dissipate directly from the outer smooth skin of the housing 202 as well as the heat dissipation structure 208 of the housing 202.

It should be understood that any number of electrical components can be included in or on aerodynamic system 200 at any one or more of locations 302, 304, and 306. Furthermore, any of the electrical components within aerodynamic system 200 may transfer heat using more than one mechanism, whether via direct contact thermal conduction, radiation, or other means.

Figure 4A:
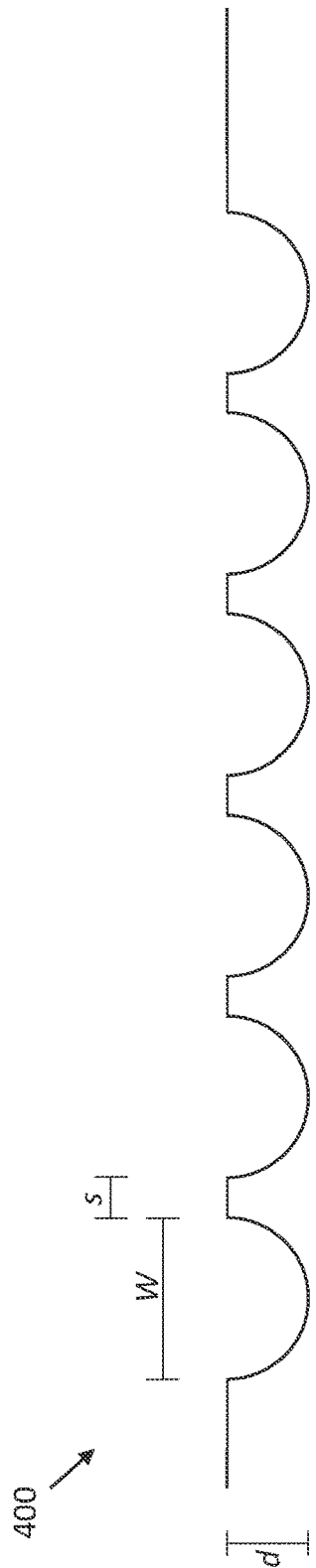
FIGS. 4A-4C illustrate cross-section views of heat dissipation structures that include annular rings, in accordance with some embodiments of the present disclosure.

FIG. 4A illustrates a cross-section view of heat dissipation structure 400 that would wrap around the perimeter of a body, such as heat dissipation structure 208 around body 202, according to an embodiment. Note the cross-section has been flattened for ease of illustration, for embodiments that include a cylindrical housing. Heat dissipation structure 400 includes a plurality of adjacent structures. The structures may be recessed into the body and have any cross-sectional shape, but in general they are ring-like. As used herein, such ring structures can have a semi-circular cross-sectional shape as shown, but may also have square, rectangular, triangular, trapezoidal, elliptical or other geometric cross-sectional shape, depending on the forming process used, as will be appreciated. According to an embodiment, the adjacent structures are recessed annular rings having a semicircular profile with a depth d that is ½ of their width W, thus making the width W effectively equal to the diameter of the recessed annular rings. Deeper or shallower depths d than ½ of the width W are also possible when using an elliptical cross-section. Of course, the top portion of the ring that would otherwise extend beyond the outer skin of the housing 202 is missing, as will be appreciated. To this end, reference to ring or circular is intended to include such partial ring or partial circle or other partial geometric shapes, as will be further appreciated. The width W of the annular rings may be adjusted depending on the application. In some examples, width W is between 0.050" and 0.200". In some examples, the width W is set for each ring to be around 0.125". Likewise, depth d may be adjusted to be any depth depending on the application, but in some example cases is in the range of is between 0.020" and 0.200". In a more general sense, the geometry of the ring-like structures can be tuned to meet the specification of a given application and can therefore vary from one embodiment to the next.

Adjacent annular rings are laterally distanced from one another by a spacings. According to some embodiments, the spacing s between adjacent ones of the annular rings is tuned to change the ability for heat dissipation structure 400 to also isolate (e.g., attenuate) particular frequency bands. The frequency band to be attenuated may be generally selected based on a pseudo-random pattern of spacings s between adjacent annular rings. As used herein, the term "pseudo-random" with regards to spacings s refers to spacings that vary according to a defined repeating pattern. In some embodiments, a random pattern of ring spacings may be used that include randomly selected spacings between a given range, such as between 0.010" and 0.035". In some embodiments, each of the spacings within a given random pattern vary from each other by some factor of 0.005". Any other ranges may be selected based on the range of achievable ring-like shape geometries and desired frequencies to isolate.

Heat dissipation structure 400 may attenuate certain RF bands based generally on the theory of corrugated surfaces. In more detail, and in accordance with some embodiments, when placed between two antennas, heat dissipation structure 400 acts as an RF choke by impeding RF currents on the conducting surface of heat dissipation structure 400. The frequencies at which heat dissipation structure 400 acts as a choke are a function of the size and periodicity of the spacing of the structures. A choke may be designed to have a given spacing and ring width to create a quarter wavelength periodicity. The effectiveness of the choke is a function of the geometry, such as the depth of the structures. For an efficient heat sink in an airflow, the cross-section of the grooves is designed in the shape of a semi-circle, such as the recessed annular rings of heat dissipation structure 400.

In some embodiments, rather than use pseudo-random spacings s between rings and consistent width W, a pseudo-random periodicity (s+W) between adjacent rings is used. Since a period is defined by the sum of both the width W and spacing s, changing the period can involve changing the spacing s, the width W, or both.

Figure 4B:
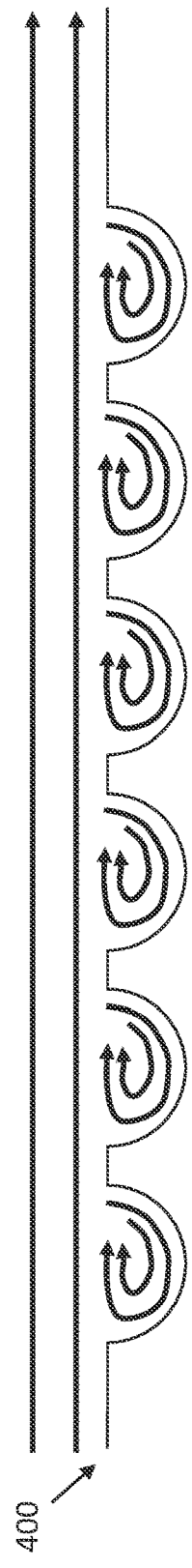

FIG. 4B illustrates an example airstream that passes over the annular ring heat dissipation structure 400 on the outside of a moving aerodynamic system, according to an embodiment. As can be seen, the airflow moves across the top surface of the structure, and air also circulates within each of the annular ring recesses. Note that similar circulation may occur in other shaped recesses, whether they are square, triangular, rectangular, trapezoidal or some other shape, although semicircular may provide smoother airflow. The fast-moving air along the top surface helps to carry away the heat dissipated from the structure. The circulating air flow within each of the recessed annular ring structures may move at much lower velocity compared to the air flow across the top surface of the aerodynamic system.

Figure 4C:
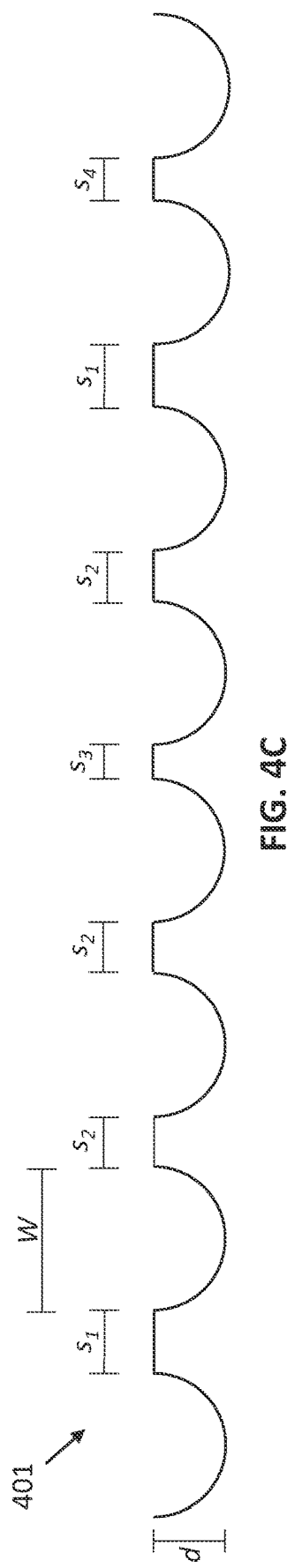

FIG. 4C illustrates a particular example of a heat dissipation structure 401, according to an embodiment. Regularly spaced, semi-circular grooves do not naturally create an efficient RF choke. Accordingly, particular spacings between adjacent rings are designed to choke given RF currents. Thus, and in accordance with an embodiment, heat dissipation structure 401 includes a pseudo-random pattern of spacings between annular, circular rings that repeats for as long as the structure extends along a given body. In some embodiments, each spacing within the pseudo-random pattern falls within a given range such as, for example, between 0.010" and 0.035". Each of the annular rings has a substantially same (e.g., within 0.002" or other acceptable tolerance) width W and depth d of R/2. In the illustrated example, the ring width W is consistently about 0.125" and the spacing between adjacent ring structures follows a pattern of $s_1, s_2, s_2, s_3, s_2, s_1, s_4$ with $s_1$=0.035", $s_2$=0.025", $s_3$=0.015", and $s_4$=0.020". The particular ring and spacing geometry of heat dissipation structure 401 exhibits a high attenuation for frequencies within the $K_a$ band, but the present disclosure is not intended to be so limited; rather, numerous other configurations can be used for any other frequency bands of interest. By adjusting the various spacings and/or pattern, the bandwidth of attenuated frequencies can be changed. Changing the spacing between adjacent ring structures changes the periodicity across heat dissipation structure 401 yielding multi-period pseudo-random annular rings.

It may be helpful to compare the annular ring design heat dissipation structure such as 401 to other designs, with respect to both heat dissipation and RF isolation. Some such alternative designs are shown in FIGS. 5A-B and 6A-B. Comparison of the various structures is then provided in Table 1 and FIG. 7.

Figure 5A:
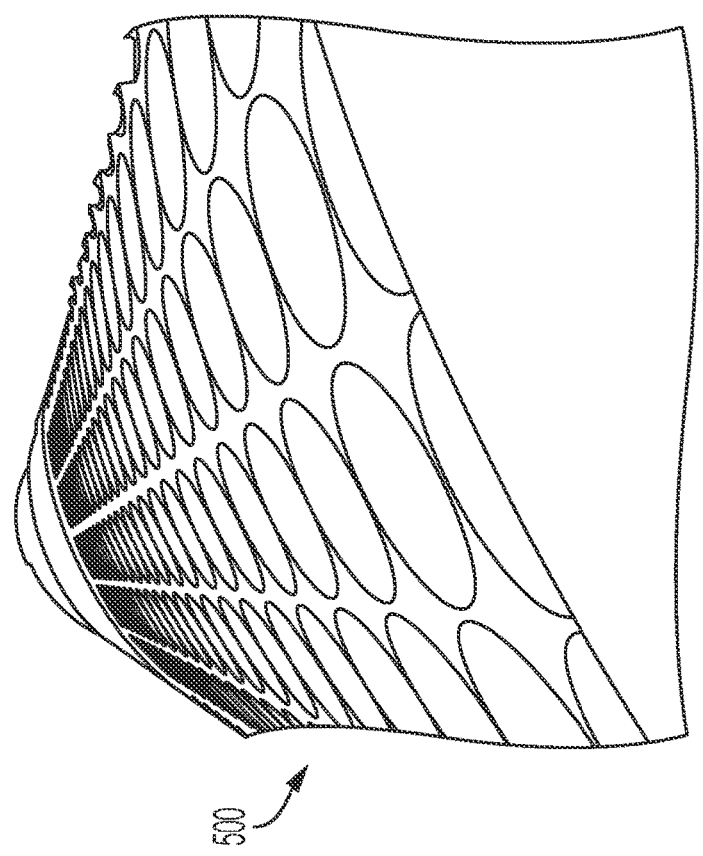
FIGS. 5A and 5B illustrate perspective and cross-section views, respectively, of a heat dissipation structure, in accordance with another embodiment of the present disclosure.
Figure 5B:
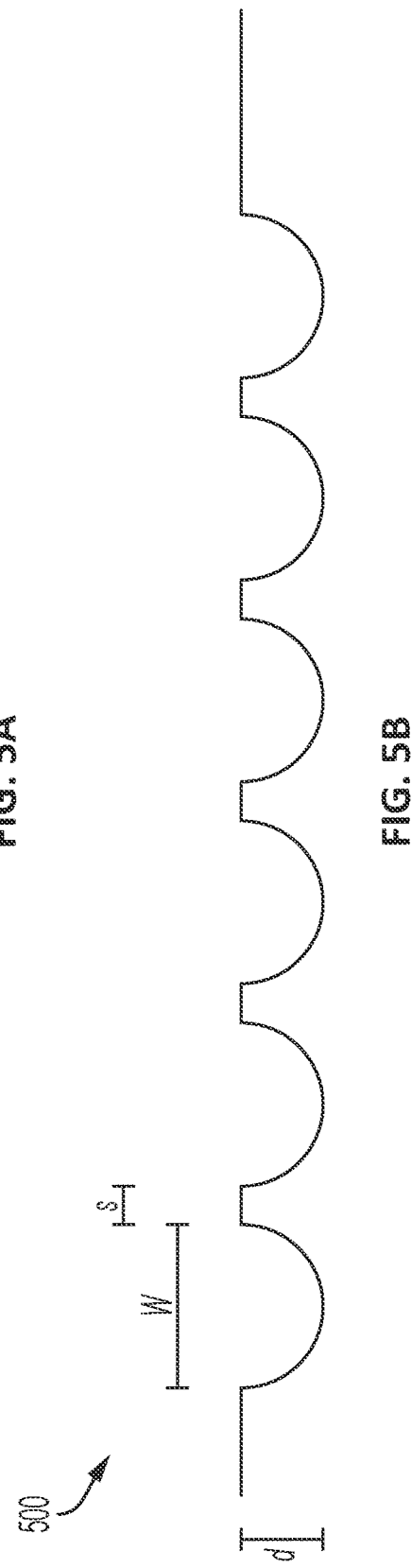

FIGS. 5A and 5B illustrate another design for a heat dissipation structure 500, according to an embodiment. Heat dissipation structure 500 includes a plurality of dimples recessed into a body, such as, for example, body 202 of aerodynamic system 200. Accordingly, heat dissipation structure 208 from FIGS. 2A, 2B, and 3 may have the same structural design as heat dissipation structure 500. FIG. 5A illustrates a three-dimensional view of heat dissipation structure 500 across an aerodynamic system body having recessed dimples. The recessed dimples may be hemispherical in shape and packed in a cubic arrangement like the arrangement illustrated in FIG. 5A. In some other examples, the recessed dimples are packed together in other arrangements such as a hexagonal arrangement, or the dimples may be spaced further apart from each other in any ordered or random arrangement.

FIG. 5B provides a cross section view of heat dissipation structure 500, according to an embodiment. Each of the dimples of heat dissipation structure 500 can be defined as having a width W and a depth d. For hemispherical dimples, the width W is equal to d×2. In some embodiments, hemispherical dimples provide an optimal sidewall advantage by exposing the most surface area for a given opening width. According to some embodiments, the depth d may range from 0.055" to 0.105". A spacings between adjacent dimples may range from 0.001" to 0.010". In some embodiments, spacing s between adjacent dimples is set to 0.005". In some embodiments, there is no spacing between adjacent dimples such that the curved surface of a given dimple transitions directly into the curved surface of each adjacent dimple.

Figure 6A:
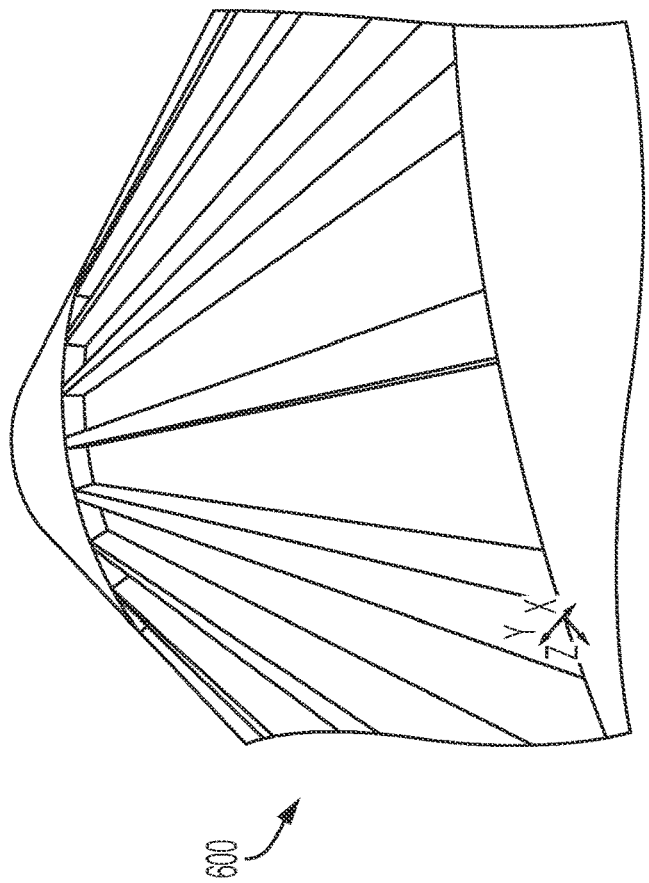
FIGS. 6A and 6B illustrate perspective and cross-section views, respectively, of a heat dissipation structure, in accordance with another embodiment of the present disclosure.
Figure 6B:
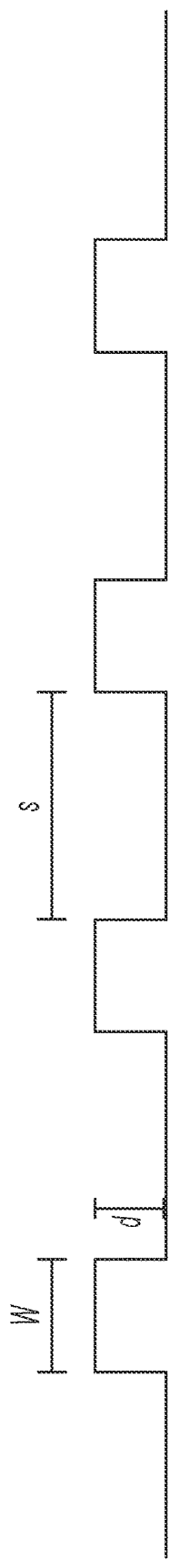

FIGS. 6A and 6B illustrate another design for a heat dissipation structure 600, according to an embodiment. Heat dissipation structure 600 includes a plurality of recessed grooves into a body, such as, for example, body 202 of aerodynamic system 200. Accordingly, heat dissipation structure 208 from FIGS. 2A, 2B, and 3 may have the same structural design as heat dissipation structure 600. FIG. 6A illustrates a three-dimensional view of heat dissipation structure 600 across an aerodynamic system body having recessed grooves. The recessed grooves have a smaller width than the distance between adjacent grooves, according to an embodiment.

FIG. 6B provides a cross section view of heat dissipation structure 600, according to an embodiment. The grooves of heat dissipation structure 500 can be defined as having a width W and a depth d. There is also a spacing s between adjacent grooves. According to some embodiments, the depth d may range from 0.030" to 0.050". A spacings between adjacent grooves may range from 0.060" to 0.160". In some embodiments, each of the grooves has a set width W between 0.010" and 0.050". In some embodiments, the width W between adjacent grooves is set to be 0.030".

Table 1 below provides a comparison between the annular ring design generally described above with the alternative heat dissipation structure designs shown in FIGS. 5A-B and 6A-B, and also to a perfectly smooth outer body. The comparisons between the structures are made for an aerodynamic system traveling at either Mach 1 and 20,000 feet or at Mach 0.5 and 5,000 feet.

TABLE 1

| Structure | % Surface Area (SA) delta from smooth | Power dissipation (M1.0 at 20 kft) | Power dissipation (M0.5 at 5 kft) |
| --- | --- | --- | --- |
| Smooth | 0% | 117.4 W | 126.1 W |
| Dimples (FIGS. 5A-5B) | 70% | 165.5 W | 183.8 W |
| Grooves (FIGS. 6A-6B) | 52% | 156.0 W | 177.8 W |
| Rings (FIGS. 4A-4C) | 42% | 161.0 W | 177.0 W |

As can be seen from the table, using dimple features or grooves provides more surface area than annular rings and the total power dissipation from either dimples or grooves is slightly higher than that of the rings, but the three designs are rather comparable with regards to heat transfer. However, the ring design allows for much higher RF isolation compared to either dimples or grooves, making it superior for use in applications that require both heat dissipation and RF isolation.

Figure 7:
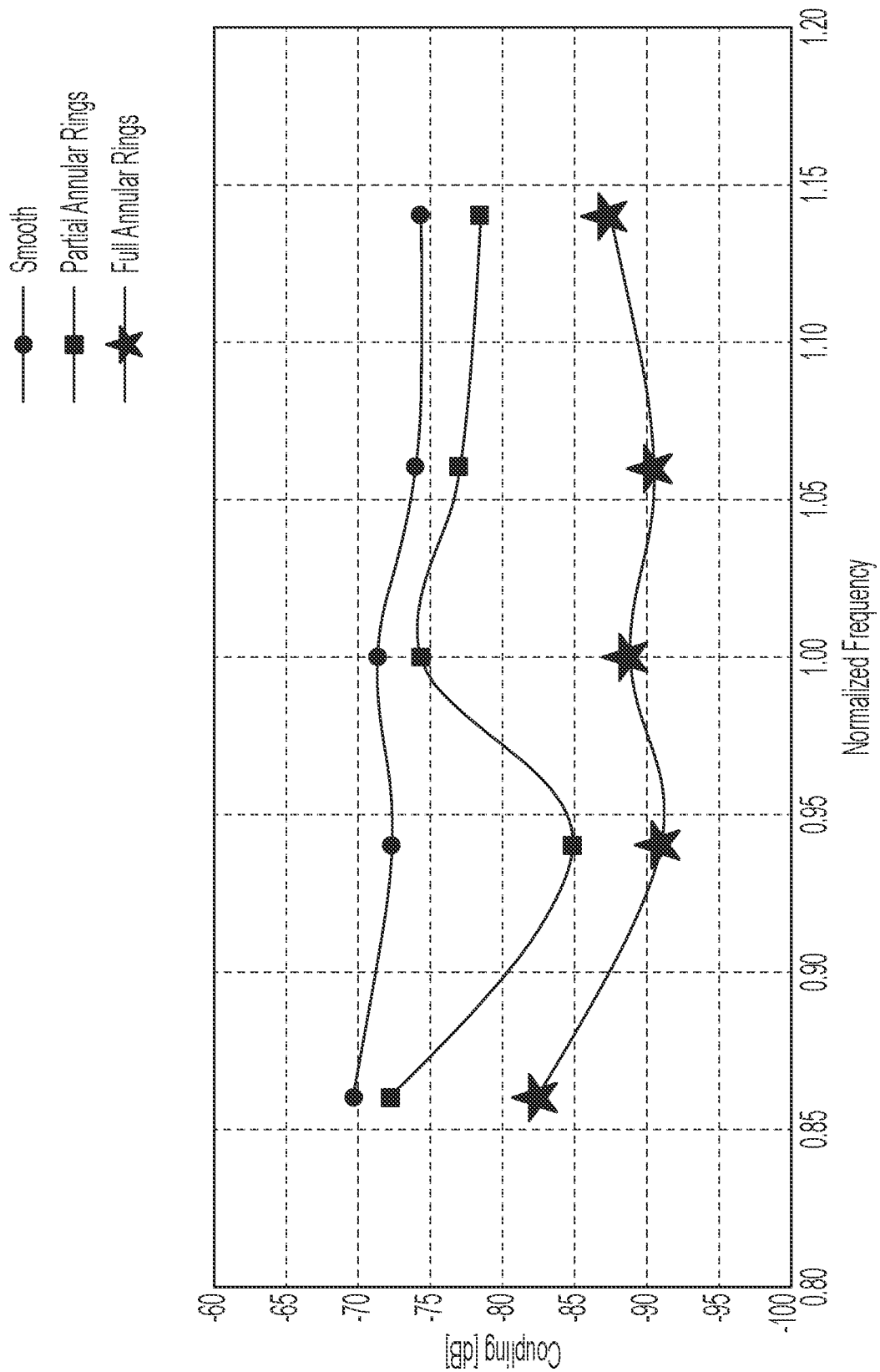
FIG. 7 is a graph comparing RF coupling isolation between a given system's receiver and transmitter for different heat dissipation structures configured in accordance with an embodiment of the present disclosure, relative to a comparable system having no such heat dissipation structures.

FIG. 7 is a graph showing the RF isolation achieved (in dB) for different geometries on the surface of a cylindrical body that houses an RF transmitter and an RF receiver, according to some embodiments. The isolation achieved between the RF transmitter and RF receiver is different for different frequencies around the center frequency used by the RF transmitter and RF receiver (e.g., normalized frequency of 1.00 represents a center frequency of the frequency bandwidth used by RF transmitter and RF receiver).

A smooth geometry (e.g., no added heat dissipation structures) provides a baseline RF isolation between the transmitter and receiver of between −70 dB and −75 dB for frequencies at or around the center frequency used by the transmitter and receiver. When using a heat dissipation structure that includes partial annular rings around the body (e.g., the rings partially extend around the circumference) according to one example embodiment, greater RF isolation is observed across all frequencies. When using a heat dissipation structure that includes full annular rings around the circumference of the body according to another example embodiment, even greater RF isolation is observed with RF coupling of at least −85 dB for most frequencies around the center frequency used by the transmitter and receiver. These results demonstrate how the ring-like heat dissipation structures that extend at least partially around the circumference of the body as variously provided herein can be effective at mitigating the heat generated by the electronics while also simultaneously serving as an RF isolation structure between the transmitter and receiver.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is an aerodynamic system having a body with a cylindrical shape and a plurality of ring structures extending around at least a portion of a circumference of the body. The plurality of ring structures are recessed into the body. A first spacing between a first adjacent pair of ring structures of the plurality of ring structures is different from a second spacing between a second adjacent pair of ring structures of the plurality of ring structures.

Example 2 includes the subject matter of Example 1, further comprising: a radio frequency (RF) transmitter disposed at a first location within the body; and an RF receiver disposed at a second location within the body. The plurality of ring structures are located between the first location and the second location along a length of the body.

Example 3 includes the subject matter of Example 1 or 2, wherein one or more of the plurality of ring structures has a circular profile recessed into the body.

Example 4 includes the subject matter of Example 3, wherein one or more of the plurality of ring structures has a width that is equal to its diameter.

Example 5 includes the subject matter of any one of Examples 1-4, wherein a width of each of the plurality of ring structures is substantially the same.

Example 6 includes the subject matter of any one of Examples 1-5, wherein a spacing between any adjacent pair of ring structures of the plurality of ring structures is between around 0.010 inches and around 0.035 inches.

Example 7 includes the subject matter of any one of Examples 1-6, wherein the plurality of ring structures extend completely around the circumference of the body.

Example 8 includes the subject matter of any one of Examples 1-7, wherein consecutive spacings between consecutive adjacent pairs of the plurality of ring structures have different widths according to a repeating pseudo-random pattern.

Example 9 includes the subject matter of any one of Examples 1-7, wherein consecutive spacings between consecutive adjacent pairs of the plurality of ring structures have different widths according to a random pattern.

Example 10 is an electronic device that includes a body, an RF transmitter disposed at a first location within the body, an RF receiver disposed at a second location within the body, and a plurality of structures extending around at least a portion of a perimeter of the body between the first location and the second location. The plurality of structures are recessed into the body. A first spacing between a first adjacent pair of structures of the plurality of structures is different from a second spacing between a second adjacent pair of structures of the plurality of structures.

Example 11 includes the subject matter of Example 10, wherein the body has a cylindrical shape and the plurality of structures include a plurality of ring structures.

Example 12 includes the subject matter of Example 11, wherein one or more of the plurality of ring structures has a circular profile recessed into the body.

Example 13 includes the subject matter of Example 12, wherein one or more of the plurality of ring structures has a width that is equal to its diameter.

Example 14 includes the subject matter of any one of Examples 10-13, wherein a width of each of the plurality of structures is substantially the same.

Example 15 includes the subject matter of any one of Examples 10-14, wherein a spacing between any adjacent pair of structures of the plurality of structures is between around 0.010 inches and around 0.035 inches.

Example 16 includes the subject matter of any one of Examples 10-15, wherein the plurality of structures extend completely around the perimeter of the body.

Example 17 includes the subject matter of any one of Examples 10-16, wherein consecutive spacings between consecutive adjacent pairs of the plurality of structures have different widths according to a repeating pseudo-random pattern.

Example 18 includes the subject matter of any one of Examples 10-16, wherein consecutive spacings between consecutive adjacent pairs of the plurality of structures have different widths according to a random pattern.

Example 19 is a heat dissipation structure that includes a plurality of ring structures extending around at least a portion of a body that houses one or more heat-generating electrical components. The plurality of ring structures are recessed into the body. A first spacing between a first adjacent pair of ring structures of the plurality of ring structures is different from a second spacing between a second adjacent pair of ring structures of the plurality of ring structures.

Example 20 includes the subject matter of Example 19, wherein one or more of the plurality of ring structures has a circular profile recessed into the body.

Example 21 includes the subject matter of Example 20, wherein one or more of the plurality of ring structures has a width that is equal to its diameter.

Example 22 includes the subject matter of any one of Examples 19-21, wherein a width of each of the plurality of ring structures is substantially the same.

Example 23 includes the subject matter of any one of Examples 19-22, wherein a spacing between any adjacent pair of ring structures of the plurality of ring structures is between around 0.010 inches and around 0.035 inches.

Example 24 includes the subject matter of any one of Examples 19-23, wherein the body has a cylindrical shape.

Example 25 includes the subject matter of Example 24, wherein the plurality of ring structures extend completely around a circumference of the body.

Example 26 includes the subject matter of any one of Examples 19-25, wherein consecutive spacings between consecutive adjacent pairs of the plurality of ring structures have different widths according to a repeating pseudo-random pattern.

Example 27 includes the subject matter of any one of Examples 19-25, wherein consecutive spacings between consecutive adjacent pairs of the plurality of ring structures have different widths according to a random pattern.

What is claimed is:

1. An aerodynamic system, comprising:
 a body having a cylindrical shape; and
 a plurality of ring structures extending around at least a portion of a circumference of the body, wherein the plurality of ring structures are recessed into the body, and wherein a first spacing between a first adjacent pair of ring structures of the plurality of ring structures is different from a second spacing between a second adjacent pair of ring structures of the plurality of ring structures.

2. The aerodynamic system of claim 1, further comprising:
 a radio frequency (RF) transmitter disposed at a first location within the body; and
 an RF receiver disposed at a second location within the body,
 wherein the plurality of ring structures are located between the first location and the second location along a length of the body.

3. The aerodynamic system of claim 1, wherein one or more of the plurality of ring structures has a circular profile recessed into the body.

4. The aerodynamic system of claim 3, wherein one or more of the plurality of ring structures has a width that is equal to its diameter.

5. The aerodynamic system of claim 1, wherein a width of each of the plurality of ring structures is substantially the same.

6. The aerodynamic system of claim 1, wherein a spacing between any adjacent pair of ring structures of the plurality of ring structures is between around 0.010 inches and around 0.035 inches.

7. The aerodynamic system of claim 1, wherein the plurality of ring structures extend completely around the circumference of the body.

8. The aerodynamic system of claim 1, wherein consecutive spacings between consecutive adjacent pairs of the plurality of ring structures have different widths according to a repeating pseudo-random pattern.

9. The aerodynamic system of claim 1, wherein consecutive spacings between consecutive adjacent pairs of the plurality of ring structures have different widths according to a random pattern.

10. An electronic device, comprising:
 a body;
 an RF transmitter disposed at a first location within the body;
 an RF receiver disposed at a second location within the body; and
 a plurality of structures extending around at least a portion of a perimeter of the body between the first location and the second location, wherein the plurality of structures are recessed into the body, and wherein a first spacing between a first adjacent pair of structures of the plurality of structures is different from a second spacing between a second adjacent pair of structures of the plurality of structures.

11. The electronic device of claim 10, wherein the body has a cylindrical shape and the plurality of structures include a plurality of ring structures.

12. The electronic device of claim 11, wherein one or more of the plurality of ring structures has a circular profile recessed into the body.

13. The electronic device of claim 12, wherein one or more of the plurality of ring structures has a width that is equal to its diameter.

14. The electronic device of claim 10, wherein the plurality of structures extend completely around the perimeter of the body.

15. The electronic device of claim 10, wherein consecutive spacings between consecutive adjacent pairs of the plurality of structures have different widths according to a repeating pseudo-random pattern.

16. A heat dissipation structure, comprising:
 a plurality of ring structures extending around at least a portion of a body that houses one or more heat-generating electrical components, wherein the plurality of ring structures are recessed into the body, and wherein a first spacing between a first adjacent pair of ring structures of the plurality of ring structures is different from a second spacing between a second adjacent pair of ring structures of the plurality of ring structures.

17. The heat dissipation structure of claim 16, wherein one or more of the plurality of ring structures has a circular profile recessed into the body.

18. The heat dissipation structure of claim 16, wherein the body has a cylindrical shape.

19. The heat dissipation structure of claim 18, wherein the plurality of ring structures extend completely around a circumference of the body.

20. The heat dissipation structure of claim 16, wherein consecutive spacings between consecutive adjacent pairs of the plurality of ring structures have different widths according to a repeating pseudo-random pattern.

* * * * *